United States Patent
Hou

(10) Patent No.: US 8,188,470 B2
(45) Date of Patent: May 29, 2012

(54) SEMICONDUCTOR STACKING LAYER AND FABRICATING METHOD THEREOF

(75) Inventor: Chih-Yuan Hou, Chiayi (TW)

(73) Assignee: Au Optronics Corporation, Hsinchu (TW)

( * ) Notice: Subject to any disclaimer, the term of this patent is extended or adjusted under 35 U.S.C. 154(b) by 172 days.

(21) Appl. No.: 12/587,425

(22) Filed: Oct. 6, 2009

(65) Prior Publication Data
US 2010/0258800 A1    Oct. 14, 2010

(30) Foreign Application Priority Data

Apr. 14, 2009    (TW) .............................. 98112349 A

(51) Int. Cl.
*H01L 29/04*    (2006.01)
(52) U.S. Cl. .................................. 257/52; 257/E29.003
(58) Field of Classification Search .................... 257/52, 257/E29.003
See application file for complete search history.

(56) References Cited

U.S. PATENT DOCUMENTS
2009/0039351 A1*  2/2009  Kobayashi et al. ............. 257/59

FOREIGN PATENT DOCUMENTS
WO    WO 2009/059238    5/2009

* cited by examiner

*Primary Examiner* — Seahvosh Nikmanesh
(74) *Attorney, Agent, or Firm* — J.C. Patents

(57) ABSTRACT

A fabricating method of a semiconductor stacking layer includes following steps. First, an amorphous silicon (a-Si) layer is formed on a substrate. Surface treatment is then performed on a surface of the a-Si layer. After that, a doped microcrystalline silicon (μc-Si) layer is formed on the treated surface of the a-Si layer, wherein interface defects existing between the a-Si layer and the doped μc-Si layer occupy an area in a cross-sectional region having a width of 1.5 micrometers and a thickness of 40 nanometers, and a ratio of the occupied area in the cross-sectional region is equal to or less than 10%. The method of fabricating the semiconductor stacking layer can be applied to a fabrication process of a semiconductor device to effectively reduce the interface defects of the semiconductor stacking layer.

10 Claims, 6 Drawing Sheets

SEMICONDUCTOR STACKING LAYER AND FABRICATING METHOD THEREOF

CROSS-REFERENCE TO RELATED APPLICATION

This application claims the priority benefit of Taiwan application serial no. 98112349, filed on Apr. 14, 2009. The entirety of the above-mentioned patent application is hereby incorporated by reference herein and made a part of specification.

BACKGROUND OF THE INVENTION

1. Field of the Invention

The present application relates to a semiconductor stacking layer and a fabricating method thereof. More particularly, the present application relates to a semiconductor stacking layer composed of an amorphous silicon (a-Si) layer and a microcrystalline silicon (μc-Si) layer and a fabricating method of the semiconductor stacking layer.

2. Description of Related Art

In recent years, due to the mature optoelectronic technology and the advanced semiconductor fabrication technology, flat panel displays are developed rapidly. Among the flat panel displays, thin film transistor liquid crystal displays (TFT-LCDs) having advantages of low operation voltage, fast response speed, light weight, and compactness have become mainstream of displays on the market.

A conventional TFT includes a substrate, a gate, a gate insulation layer, a semiconductor layer, an ohmic contact layer, a source, and a drain. The gate is disposed on the substrate, and the gate insulation layer is disposed on the substrate and covers the gate. The semiconductor layer is disposed on the gate insulation layer and located above the gate. The ohmic contact layer is disposed on a portion of the semiconductor layer, and the source and the drain are disposed on the ohmic contact layer. When a turn-on voltage is input to the gate, the semiconductor layer becomes conductive, and thus the source and the drain can be conducted through the semiconductor layer.

In general, the semiconductor layer in the TFT is mainly composed of a channel layer and an ohmic contact layer. A material of the channel layer is un-doped a-Si or lightly doped a-Si, and a material of the ohmic contact layer is n-type heavily doped a-Si or n-type heavily doped μc-Si. Compared to the a-Si material, μc-Si has better doping efficiency and lower resistivity due to the material and structural properties of μc-Si. Therefore, μc-Si has been gradually applied to fabrication of the ohmic contact layer. Nonetheless, when μc-Si is applied to fabrication of TFTs or other semiconductor devices, there exist defects on interfaces between μc-Si and other thin films because of the difference between the properties of μc-Si and those of the thin films. These defects adversely affect characteristics of the semiconductor devices.

Therefore, during fabrication of the semiconductor devices, it is rather imperative to remove or reduce the interface defects existing between μc-Si and other thin films.

SUMMARY OF THE INVENTION

The present application is directed to a semiconductor stacking layer having favorable electrical properties.

The present application is further directed to a fabricating method of a semiconductor stacking layer. By applying the method, interface defects existing between an a-Si layer and a doped μc-Si layer in the semiconductor stacking layer can be reduced in an effective manner.

A fabricating method of a semiconductor stacking layer is provided herein. The fabricating method is described below. First, an a-Si layer is formed on a substrate. Surface treatment is then performed on a surface of the a-Si layer. After that, a doped μc-Si layer is formed on the treated surface of the a-Si layer. Here, interface defects existing between the a-Si layer and the doped μc-Si layer occupy an area in a cross-sectional region having a width of 1.5 micrometers and a thickness of 40 nanometers, and a ratio of the occupied area in the cross-sectional region is equal to or less than 10%.

According to an embodiment of the present invention, the surface treatment includes pretreatment performed on the surface of the a-Si layer with use of hydrogen plasma, argon plasma, or nitrogen plasma.

According to an embodiment of the present invention, the ratio of the aforesaid occupied area in the cross-sectional region ranges from 2% to 10%.

According to an embodiment of the present invention, in the fabricating method of the semiconductor stacking layer, after the doped μc-Si layer is formed, the interface defects are inconsecutively distributed on the surface of the a-Si layer.

A semiconductor stacking layer including an a-Si layer and a doped μc-Si layer is further provided herein. The doped μc-Si layer is located on a surface of the a-Si layer. Here, a plurality of interface defects exist between the a-Si layer and the doped μc-Si layer. The interface defects occupy an area in a cross-sectional region having a width of 1.5 micrometers and a thickness of 40 nanometers, and a ratio of the occupied area in the cross-sectional region is equal to or less than 10%.

According to an embodiment of the present invention, the ratio of the aforesaid occupied area in the cross-sectional region ranges from 2% to 10%.

According to an embodiment of the present invention, the interface defects are porous.

According to an embodiment of the present invention, the interface defects are inconsecutively distributed between the a-Si layer and the doped μc-Si layer.

Based on the above, the surface treatment is performed on the surface of the a-Si layer before the doped μc-Si layer is deposited onto the a-Si layer, such that the treated surface of the a-Si layer is conducive to subsequent growth of the doped μc-Si layer according to the present application. Thereby, the interface defects between the a-Si layer and the doped μc-Si layer can be effectively reduced.

In order to make the aforementioned and other features and advantages of the present invention more comprehensible, several embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A is an electron microscope picture showing a doped μc-Si layer and an a-Si layer on which surface treatment is not performed, while

DESCRIPTION OF EMBODIMENTS

First Embodiment

Figure 1A:
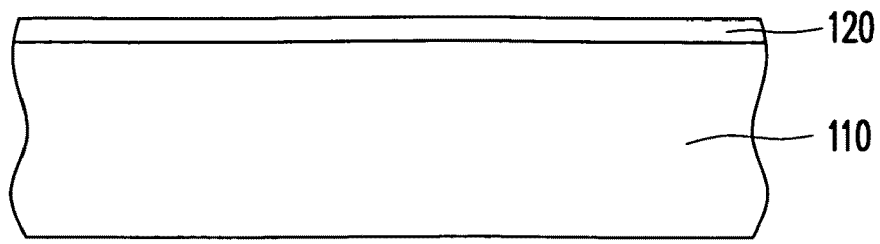
FIGS. 1A to 1C are schematic cross-sectional views illustrating a fabricating method of a semiconductor stacking layer according to an embodiment of the present invention.
Figure 1B:
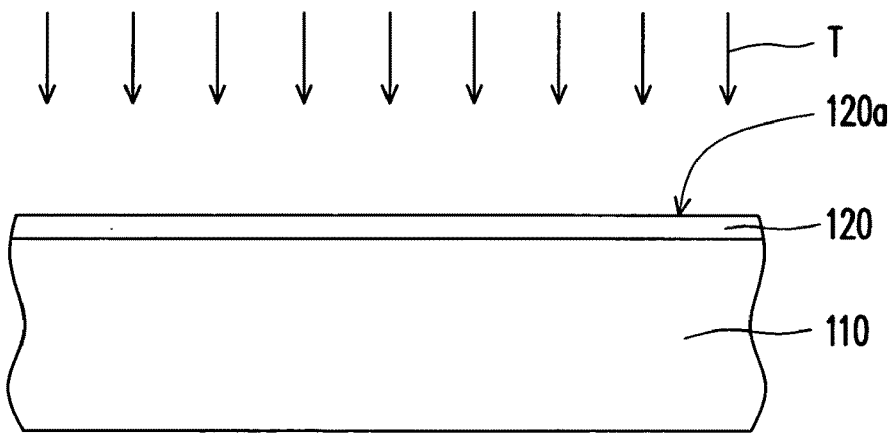
Figure 1C:
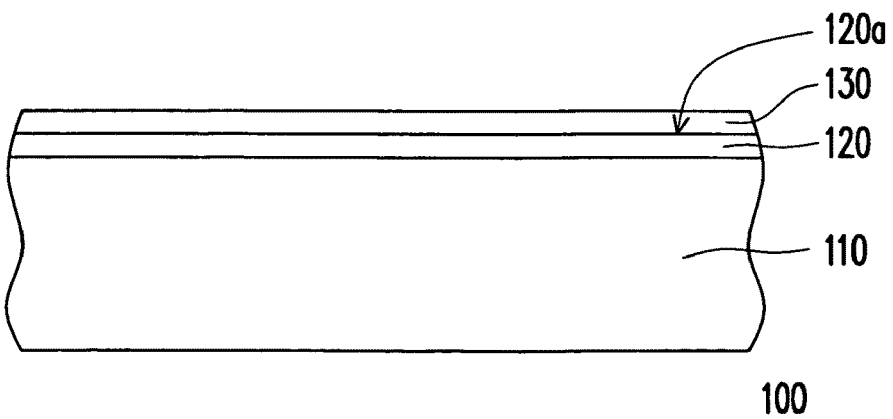

FIGS. 1A to 1C are schematic cross-sectional views illustrating a fabricating method of a semiconductor stacking layer according to an embodiment of the present invention. Referring to FIG. 1A, first, an a-Si layer 120 is formed on a substrate 110. Next, referring to FIG. 1B, after formation of the a-Si layer 120, surface treatment T is performed on a surface 120a of the a-Si layer 120. Thereby, silicon atoms on the surface 120a of the a-Si layer 120 can be orderly arranged. Namely, after the surface treatment T is performed, the treated surface 120a of the a-Si layer 120 is conducive to subsequent formation of a doped μc-Si layer 130.

In the present embodiment, the surface treatment T refers to pretreatment performed on the surface 120a of the a-Si layer 120 with use of hydrogen ($H_2$) plasma. Specifically, the $H_2$ plasma improves structural compactness of the surface 120a of the a-Si layer 120 so as to enhance bonding strength between the a-Si layer 120 and the doped μc-Si layer 130. In other feasible embodiments, the surface treatment T can refer to pretreatment performed on the surface 120a of the a-Si layer 120 with use of argon plasma or nitrogen plasma.

Referring to FIG. 1C, the doped μc-Si layer 130 is formed on the surface 120a of the a-Si layer 120. Here, the surface treatment T has already been performed on the surface 120a of the a-Si layer 120. According to the present embodiment, the doped μc-Si layer 130 can be an n-type doped μc-Si layer, a p-type doped μc-Si layer, or a combination thereof.

Figure 2:
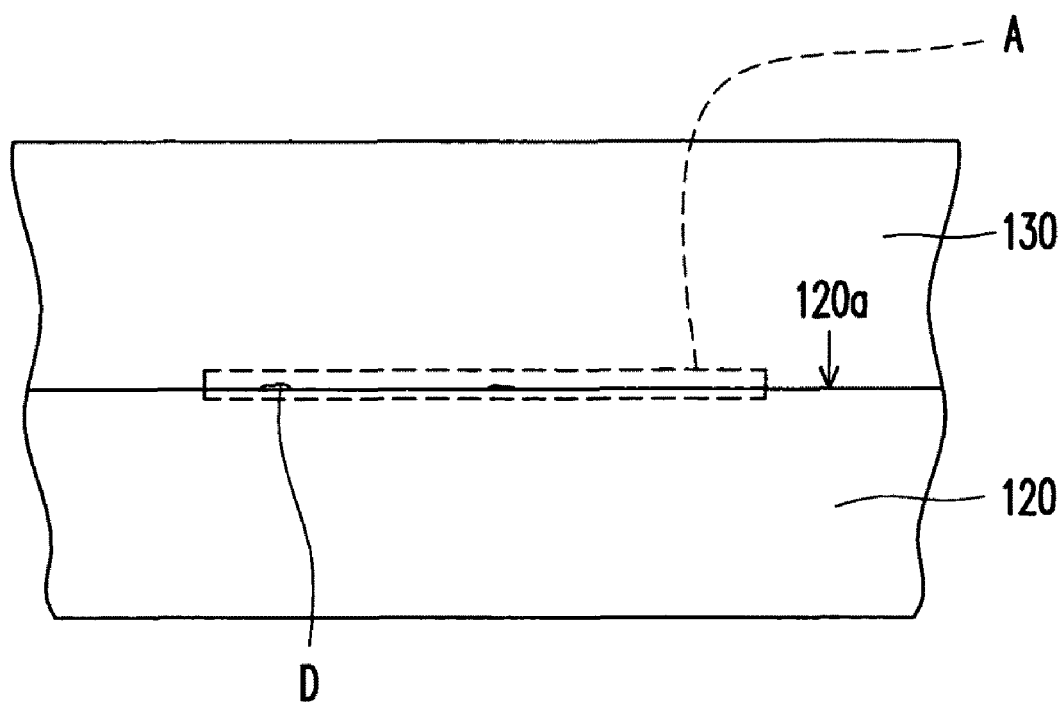
FIG. 2 is a schematic partially enlarged view of FIG. 1C.

FIG. 2 is a schematic partially enlarged view of FIG. 1C. Referring to FIG. 2, as described above, interface defects D exist between the a-Si layer 120 and the doped μc-Si layer 130. The interface defects D occupy an area in a cross-sectional region A having a width of 1.5 micrometers and a thickness of 40 nanometers, and a ratio of the occupied area in the cross-sectional region A is equal to or less than 10%. In the present embodiment, the area occupied by the interface defects D in the cross-sectional region A accounts for 2%~10% of the total area of the cross-sectional region A, preferably 5%~10%. Additionally, the interface defects D are porous. In the present embodiment, after the doped μc-Si layer 130 is formed, the interface defects D are inconsecutively distributed on the surface 120a of the a-Si layer 120.

It should be mentioned that the scopes and types of the applications of the semiconductor stacking layer 100 are not limited herein. The semiconductor stacking layer 100 can be further applied to fabrication of other types of semiconductor devices, e.g. TFTs. Moreover, the present invention can also be extensively applied to various end products, e.g. thin film liquid crystal displays or solar cells. A fabricating method of the semiconductor stacking layer is described in a second embodiment below when the fabricating method is applied to fabrication of TFTs.

Second Embodiment

Figure 3A:
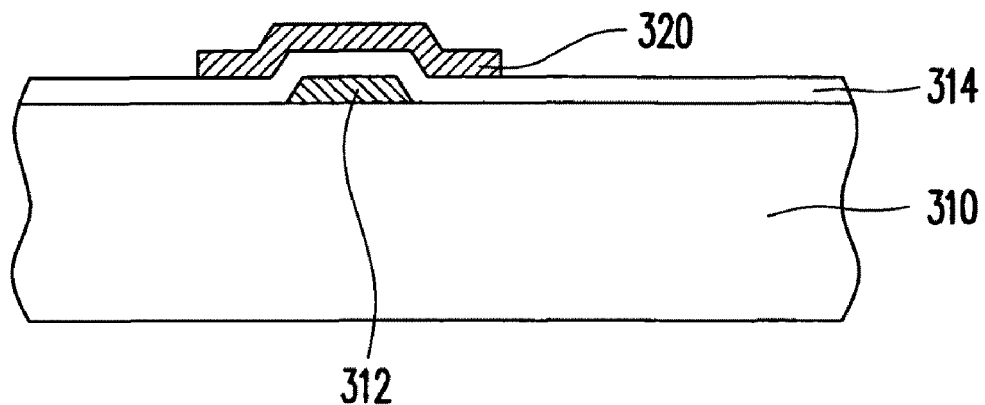
FIGS. 3A to 3D are schematic cross-sectional views illustrating a fabricating method of a TFT according to an embodiment of the present invention.

FIGS. 3A to 3D are schematic cross-sectional views illustrating a fabricating method of a TFT according to an embodiment of the present invention. Referring to FIG. 3A, in the present embodiment, a gate 312 and a gate insulation layer 314 are formed on the substrate 310. In particular, the gate 312 is formed by first forming a gate material layer (not shown) on the substrate 310. Next, the gate material layer is patterned to form the gate 312. Thereafter, the gate insulation layer 314 is formed on the gate 312 and the substrate 310. Finally, an a-Si layer 320 is formed on the gate insulation layer 314, as indicated in FIG. 3A.

Figure 3B:
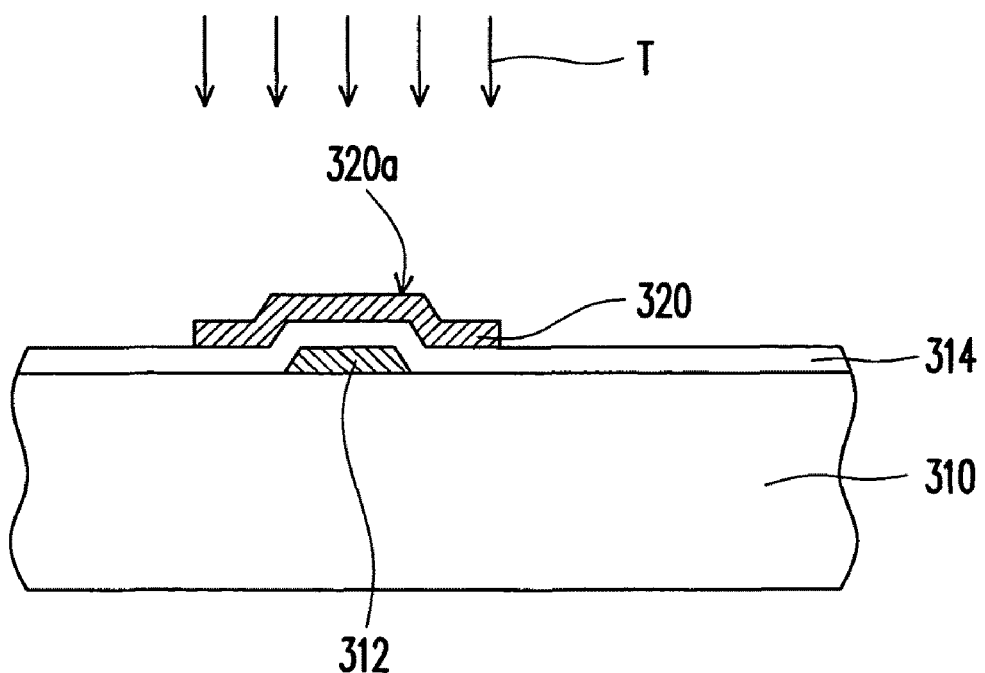

Referring to FIG. 3B, after formation of the a-Si layer 320, surface treatment T is performed on a surface 320a of the a-Si layer 320. Thereby, silicon atoms on the surface 320a of the a-Si layer 320 can be orderly arranged. Namely, after the surface treatment T is performed, the treated surface 320a of the a-Si layer 320 is conducive to subsequent formation of a doped μc-Si layer 330. Hence, by performing the surface treatment T before the formation of the doped μc-Si layer 330, interface defects D existing between the a-Si layer 320 and the doped μc-Si layer 330 can be effectively reduced.

In the present embodiment, the surface treatment T refers to pretreatment performed on the surface 320a of the a-Si layer 320 with use of $H_2$ plasma. Specifically, the pretreatment performed with use of the $H_2$ plasma improves structural compactness of the surface 320a of the a-Si layer 320 so as to enhance bonding strength between the a-Si layer 320 and the doped μc-Si layer 330 and to reduce the interface defects. In other feasible embodiments, the surface treatment T can refer to pretreatment performed on the surface 320a of the a-Si layer 320 with use of argon plasma or nitrogen plasma.

Figure 3C:
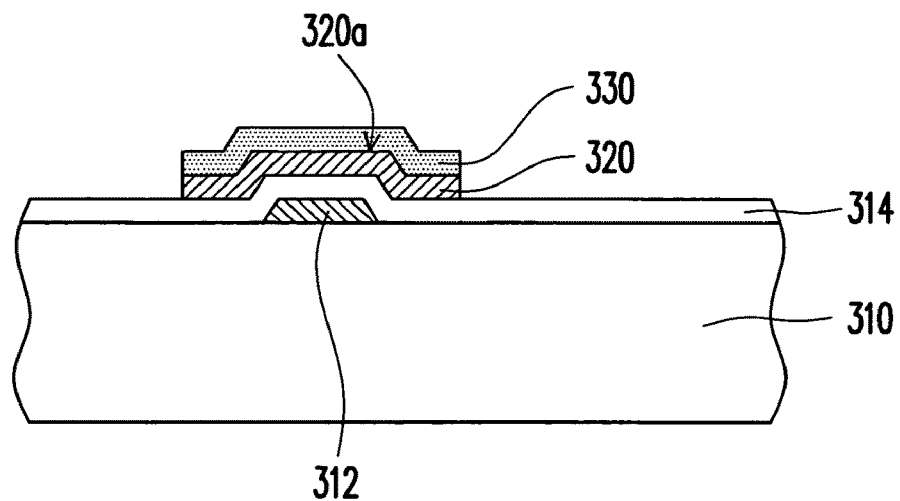
Figure 3D:
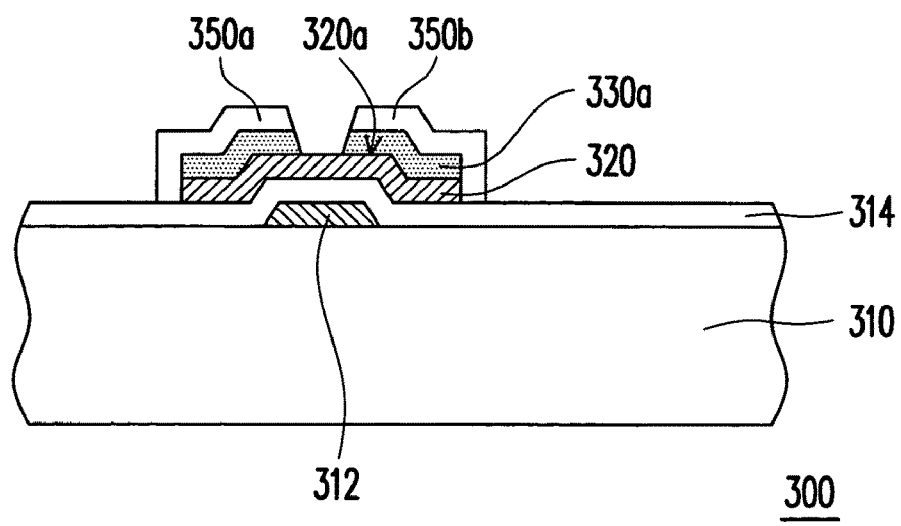

Referring to FIGS. 3C and 3D, the doped μc-Si layer 330 is formed on the surface 320a of the a-Si layer 320. Here, the surface treatment T has already been performed on the surface 320a of the a-Si layer 320. According to the present embodiment, the doped μc-Si layer 330 can be an n-type doped μc-Si layer, a p-type doped μc-Si layer, or a combination thereof.

After the formation of the doped μc-Si layer 330, a source 350a and a drain 350b both covering the doped μc-Si layer 330 are formed on the substrate 310 in the present embodiment. Specifically, a metal material layer (not shown) is firstly formed on the substrate 310 to cover the doped μc-Si layer 330. The metal material layer and a portion of the doped μc-Si layer 330 are then patterned to form a TFT 300 having the source 350a, the drain 350b, and the patterned doped μc-Si layer 330a, as indicated in FIG. 3D. By performing the surface treatment T on the a-Si layer 320 and the doped μc-Si layer 330, the number of the interface defects D can be reduced. As such, the TFT 300 has favorable electrical properties.

Figure 4:
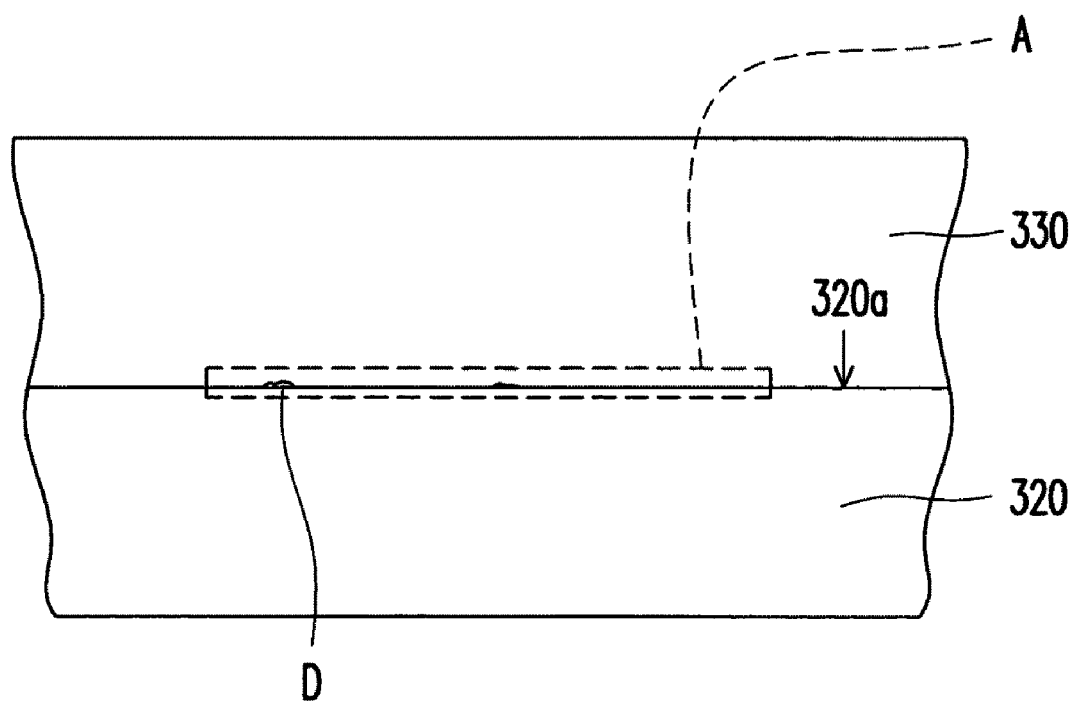
FIG. 4 is a schematic partially enlarged view of FIG. 3C.

FIG. 4 is a schematic partially enlarged view of FIG. 3C. Referring to FIG. 4, as described above, the interface defects D exist between the a-Si layer 320 and the doped μc-Si layer 330. The interface defects D occupy an area in a cross-sectional region A having a width of 1.5 micrometers and a thickness of 40 nanometers, and a ratio of the occupied area in the cross-sectional region A is equal to or less than 10%. In the present embodiment, the area occupied by the interface defects D in the cross-sectional region A accounts for 2%~10% of the total area of the cross-sectional region A, preferably 5%~10%. Additionally, the interface defects D are porous. In the present embodiment, after the doped μc-Si layer 330 is formed, the interface defects D are inconsecutively distributed on the surface 320a of the a-Si layer 320.

Given that the surface treatment T is performed before the doped μc-Si layer 130 is formed on the a-Si layer 120, the area occupied by the interface defects D in the cross-sectional region A is indeed decreased, which can be evidenced by experiments as follows.

Figure 5A:
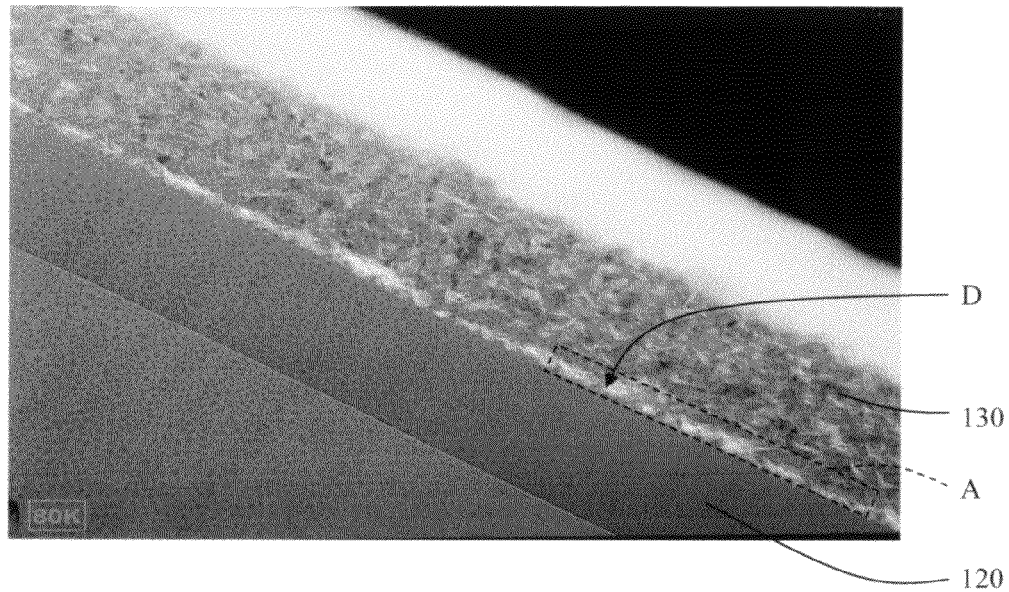
Figure 5B:
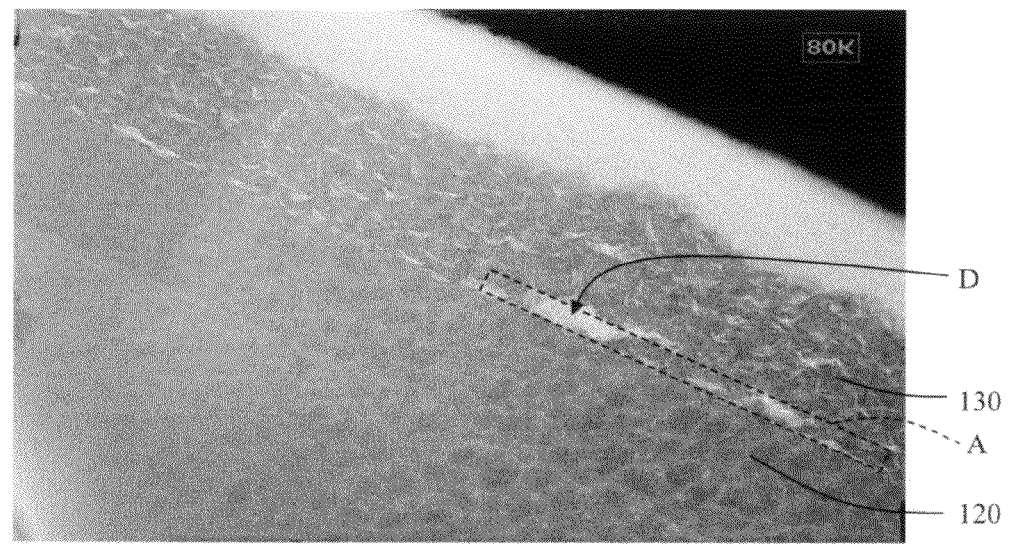
FIG. 5B is an electron microscope picture showing the doped μc-Si layer and the a-Si layer on which the surface treatment is already performed.

FIG. 5A is an electron microscope picture showing a doped μc-Si layer and an a-Si layer on which surface treatment is not performed, while FIG. 5B is an electron microscope picture showing the doped μc-Si layer and the a-Si layer on which the surface treatment is already performed. Here, the thickness of the a-Si layer 120 is approximately 200~220 nanometers, and the thickness of the doped μc-Si layer 130 is approximately 240~260 nanometers. As indicated in FIGS. 5A and 5B, within a certain area of the cross-sectional region A, there exist more interface defects D between the a-Si layer 120 and the doped μc-Si layer 130 when the surface treatment T is not performed on a surface of the a-Si layer 120, whereas less interface defects D exist between the a-Si layer 120 and the doped μc-Si layer 130 when the surface treatment T is already performed on the surface of the a-Si layer 120. Besides, the interface defects D are inconsecutively distributed on the surface of the a-Si layer 120 when the surface treatment T is performed. That is to say, if the surface treatment T is performed on the surface of the a-Si layer 120 before the doped μc-Si layer 130 is formed thereon, the interface defects D between the a-Si layer 120 and the doped μc-Si layer 130 can be effectively reduced.

In light of the foregoing, the surface treatment is performed on the surface of the a-Si layer before the doped layer is deposited onto the a-Si layer, such that the treated surface of the a-Si layer is conducive to subsequent growth of the doped μc-Si layer according to the present application. Thereby, the interface defects between the a-Si layer and the doped μc-Si layer can be effectively reduced.

Although the present invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A semiconductor stacking layer of a semiconductor device formed on a substrate, comprising:
   an amorphous silicon layer formed over the substrate; and
   a doped microcrystalline silicon layer formed on the amorphous silicon layer, wherein the amorphous silicon layer is between the substrate and the doped microcrystalline silicon layer, and a plurality of interface defects exist between the amorphous silicon layer and the doped microcrystalline silicon layer, the interface defects occupy an area in a cross-sectional region having a width of 1.5 micrometers and a thickness of 40 nanometers, and a ratio of the occupied area of the interface defects in the cross-sectional region is equal to or less than 10%.

2. The semiconductor stacking layer as claimed in claim 1, wherein the ratio of the occupied area in the cross-sectional region having the width of 1.5 micrometers and the thickness of 40 nanometers ranges from 2% to 10%.

3. The semiconductor stacking layer as claimed in claim 1, wherein the ratio of the occupied area in the cross-sectional region having the width of 1.5 micrometers and the thickness of 40 nanometers ranges from 5% to 10%.

4. The semiconductor stacking layer as claimed in claim 1, wherein the interface defects are porous.

5. The semiconductor stacking layer as claimed in claim 1, wherein the interface defects are inconsecutively distributed between the amorphous silicon layer and the doped microcrystalline silicon layer.

6. A semiconductor device, comprising:
   a substrate;
   a gate electrode formed on the substrate;
   a gate insulating layer formed over the gate electrode;
   an amorphous silicon layer formed on the gate insulating layer;
   a doped microcrystalline silicon layer formed on the amorphous silicon layer, wherein a plurality of interface defects exist between the amorphous silicon layer and the doped microcrystalline silicon layer, the interface defects occupy an area in a cross-sectional region having a width of 1.5 micrometers and a thickness of 40 nanometers, and a ratio of the occupied area of the interface defects in the cross-sectional region is equal to or less than 10%; and
   a source and a drain, wherein the source and the drain are formed on the doped microcrystalline silicon layer.

7. The semiconductor device as claimed in claim 6, wherein the ratio of the occupied area in the cross-sectional region having the width of 1.5 micrometers and the thickness of 40 nanometers ranges from 2% to 10%.

8. The semiconductor device as claimed in claim 6, wherein the ratio of the occupied area in the cross-sectional region having the width of 1.5 micrometers and the thickness of 40 nanometers ranges from 5% to 10%.

9. The semiconductor device as claimed in claim 6, wherein the interface defects are porous.

10. The semiconductor device as claimed in claim 6, wherein the interface defects are inconsecutively distributed between the amorphous silicon layer and the doped microcrystalline silicon layer.

* * * * *